US006241532B1

(12) United States Patent
Howell

(10) Patent No.: US 6,241,532 B1
(45) Date of Patent: Jun. 5, 2001

(54) HIGH DENSITY ELECTRICAL CONNECTOR ASSEMBLY AND CONNECTOR FOR USE THEREWITH

(75) Inventor: Robert P. Howell, San Jose, CA (US)

(73) Assignee: Exatron, Inc., San Jose, CA (US)

( * ) Notice: Subject to any disclaimer, the term of this patent is extended or adjusted under 35 U.S.C. 154(b) by 0 days.

(21) Appl. No.: 09/344,644

(22) Filed: Jun. 25, 1999

(51) Int. Cl.$^7$ ....................................................... H01R 9/09
(52) U.S. Cl. ................................................. 439/67; 439/66
(58) Field of Search .......................................... 439/67, 66

(56) References Cited

U.S. PATENT DOCUMENTS

| | | | |
|---|---|---|---|
| 4,548,451 | * 10/1985 | Benarr et al. | 339/17 M |
| 5,691,041 | * 11/1997 | Frankeny et al. | 428/209 |
| 5,795,162 | * 8/1998 | Lambert | 439/63 |

* cited by examiner

*Primary Examiner*—Lincoln Donovan
*Assistant Examiner*—Thanh-Tam Le
(74) *Attorney, Agent, or Firm*—Flehr Hohbach Test Albritton & Herbert LLP

(57) ABSTRACT

A high density electrical connector assembly comprising first and second sheet-like bodies. The first sheet-like body is made from an insulating material and has a surface and a plurality of electrical traces extending to a plurality of first interconnect pads disposed on the surface in a first pattern. The second sheet-like body is also made from an insulating material and has a surface and a plurality of second electrical traces extending to a plurality of second interconnect pads disposed on the surface of the second sheet-like body in a second pattern. The second pattern is substantially a mirror image of the first pattern. The surface of the first sheetlike body faces the surface of the second sheet-like body so that the first interconnect pads face the second interconnect pads. A flexible sheet of an insulating and compliant material is disposed between the first and second interconnect pads and has first and second opposite surfaces. A plurality of first connector pads is disposed on the first surface in the first pattern and a plurality of second connector pads is disposed on the second surface in the second pattern and electrically connected through the flexible sheet to the first connector pads. A Clamping assembly is mountable to the first and second sheet-like bodies for urging the first and second sheet-like bodies and the flexible sheet together so that the first interconnect pads register with and engage the first connector pads and the second interconnect pads register with and engage the second connector pads. The compliant material of the flexible sheet facilitates electrical connections between the first interconnect pads and the first connector pads and between the second interconnect pads and the second connector pads for making electrical connections between the first and second interconnect pads.

16 Claims, 4 Drawing Sheets

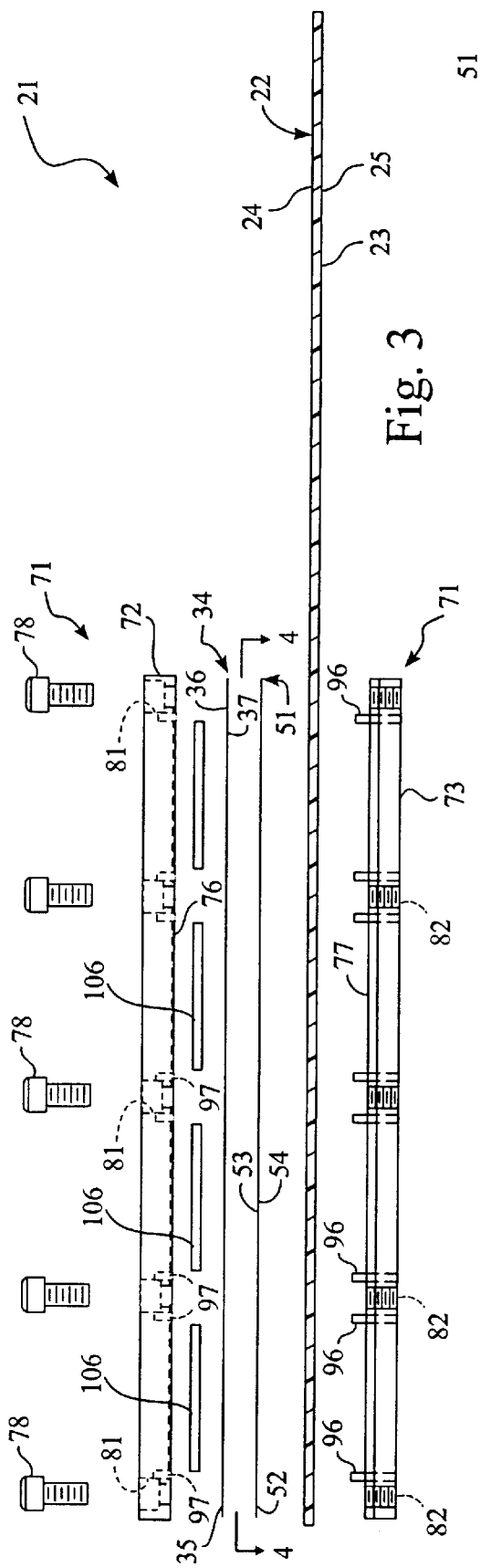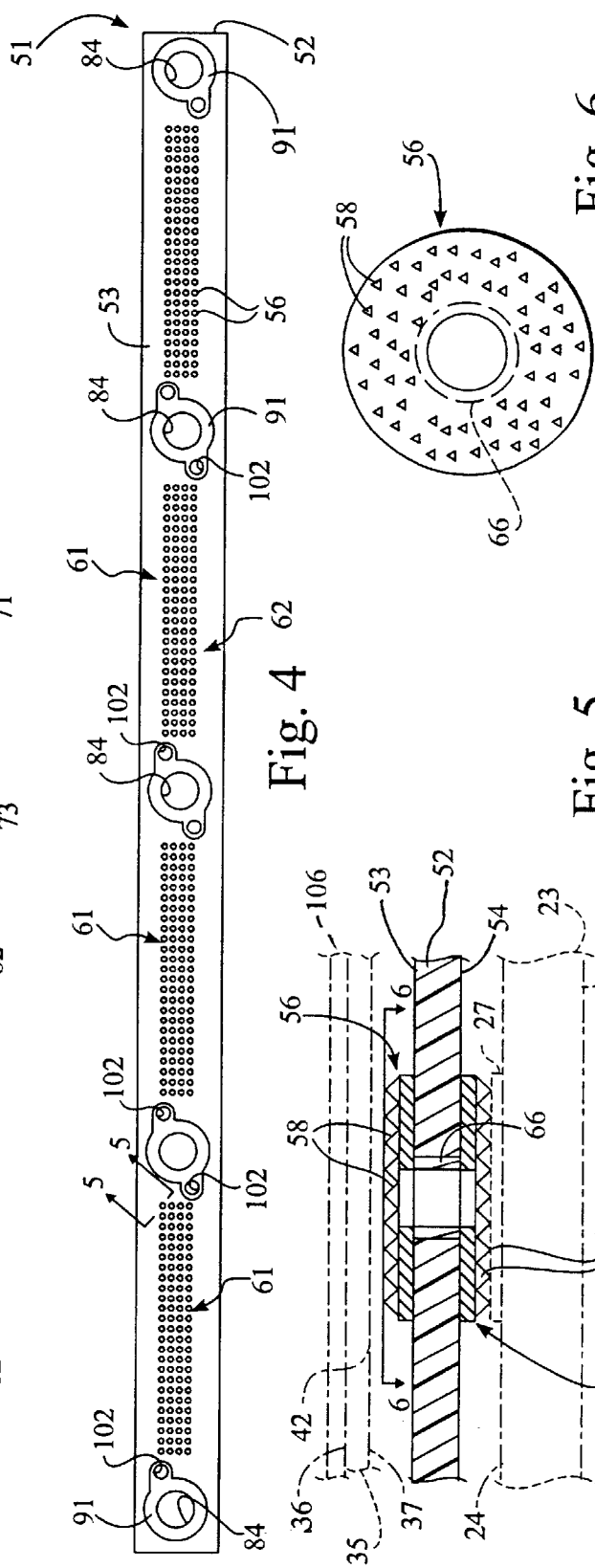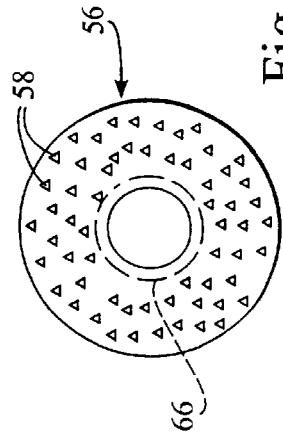
Fig. 3
Fig. 4
Fig. 5
Fig. 6

HIGH DENSITY ELECTRICAL CONNECTOR ASSEMBLY AND CONNECTOR FOR USE THEREWITH

This invention pertains to electrical connector assemblies and, more particularly, to high density electrical connector assemblies.

Apparatus and methods for electrically connecting first and printed circuit boards, first and second flexible cables and a flexible cable to a printed circuit board have heretofore been provided. In one such apparatus and method for connecting a first printed circuit board to a second printed circuit board or a flexible cable, each of the traces of the first printed circuit board are electrically connected to a pin which extends through a corresponding bore in the second printed circuit board or flexible cable to electrically connect by soldering to a trace of the second printed circuit board or flexible cable. Unfortunately, the size of such pin connectors limit the density of electrical connections per unit area of the first printed circuit board. In addition, the pin connectors are easily damaged by bending or breaking and the printed circuit board itself is susceptible to damage during the soldering process. Furthermore, such soldering is not advantageous when a temporary electrical connection is desired.

In another such apparatus and method, a layer of a rubber material having a plurality of electrically conductive wire-like elements extending perpendicular to the first and second planar surfaces of the rubber layer is disposed between a plurality of first interconnect pads of a first printed circuit board and a plurality of second interconnect pads of a second printed circuit board arranged in a pattern corresponding to the first interconnect pads. In a similar apparatus, a matrix of small metal balls suspended in a layer of rubber is provided. A clamp sandwiches the rubber layer between the first and second printed circuit boards. The plurality of wire-like elements or stacking ball-type elements extending between a respective pair of first and second aligned interconnect pads serves to electrically connect such first and second interconnect pads. Unfortunately, the rubber layer requires that significant clamping forces be applied to the first and second printed circuit boards to ensure an electrical connection between the plurality of first and second interconnect pads.

In general, it is an object of the present invention to provide a high density electrical connector assembly that has a small footprint.

Another object of the invention is to provide a high density electrical connector assembly of the above character that does not utilize soldered connections.

Additional objects and features of the invention will appear from the following description from which the preferred embodiments are set forth in detail in conjunction with the accompanying drawings.

FIG. 3 is an exploded cross-sectional view of the high density electrical connector assembly of FIG. 1 taken along the line 3—3 of FIG. 1.

FIG. 4 is a plan view of a connector for use with the high density electrical connector assembly of FIG. 1.

FIG. 5 is a cross-sectional view of a portion of the connector of FIG. 4 taken along the line 5—5 of FIG. 4 with a portion of the high density electrical connector assembly of FIG. 1 shown in phantom lines therein.

FIG. 6 is a top plan view of the connector of FIG. 4 taken along the line 6—6 of FIG. 5.

In general, a high density electrical connector assembly comprising first and second sheet-like bodies is provided. The first sheet-like body is made from an insulating material and has a surface and a plurality of electrical traces extending to a plurality of first interconnect pads disposed on the surface in a first pattern. The second sheet-like body is also made from an insulating material and has a surface and a plurality of second electrical traces extending to a plurality of second interconnect pads disposed on the surface of the second sheet-like body in a second pattern. The second pattern is substantially a mirror image of the first pattern. The surface of the first sheet-like body faces the surface of the second sheet-like body so that the first interconnect pads face the second interconnect pads. A flexible sheet of an insulating and compliant material is disposed between the first and second interconnect pads and has first and second opposite surfaces. A plurality of first connector pads is disposed on the first surface in the first pattern and a plurality of second connector pads is disposed on the second surface in the second pattern and electrically connected through the flexible sheet to the first connector pads. Clamping means is mountable to the first and second sheet-like bodies for urging the first and second sheet-like bodies and the flexible sheet together so that the first interconnect pads register with and engage the first connector pads and the second interconnect pads register with and engage the second connector pads. The compliant material of the flexible sheet facilitates electrical connections between the first interconnect pads and the first connector pads and between the second interconnect pads and the second connector pads for making electrical connections between the first and second interconnect pads.

Figure 1:
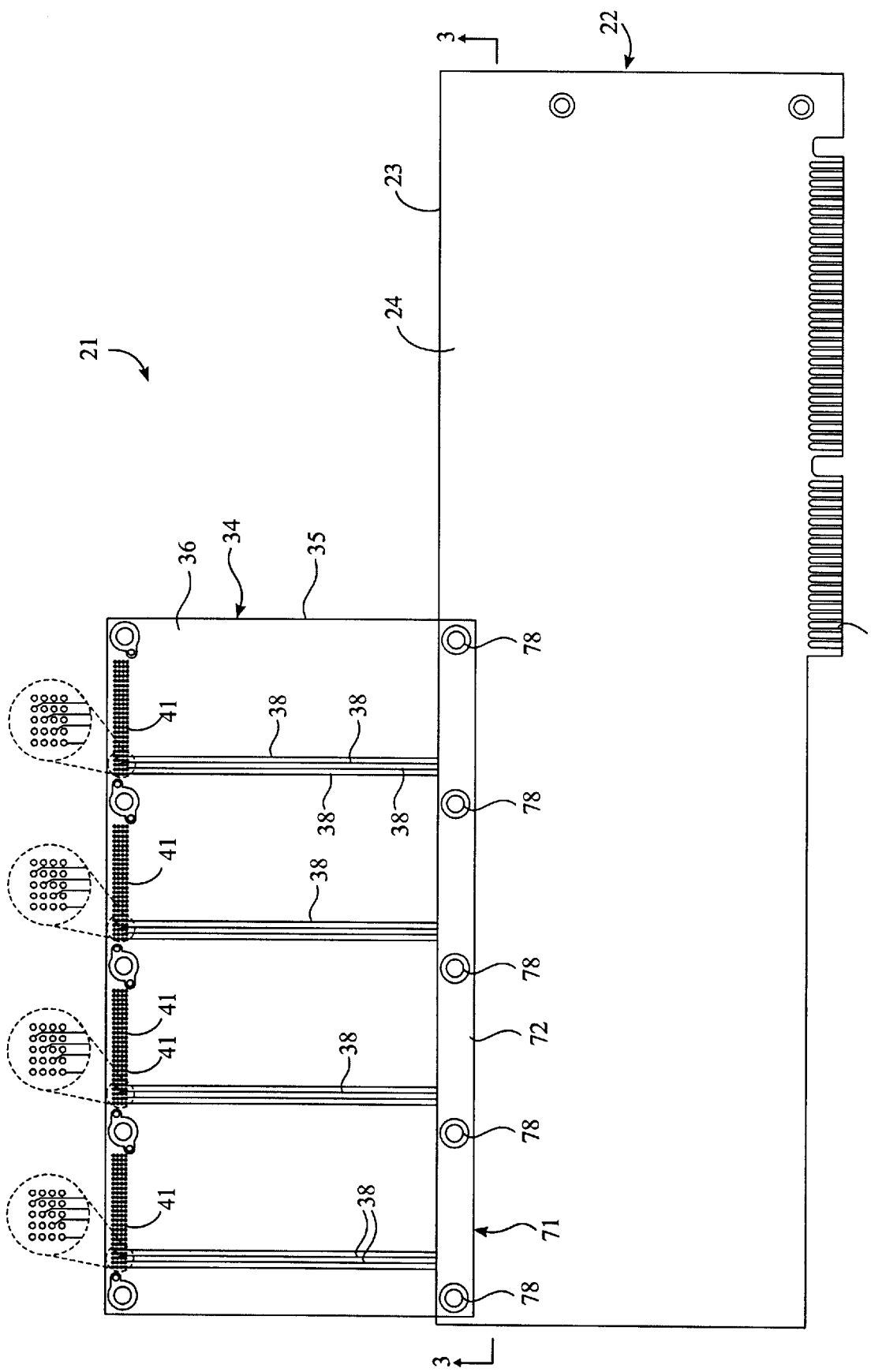
FIG. 1 is an isometric view of a high density electrical connector assembly of the present invention.
Figure 2:
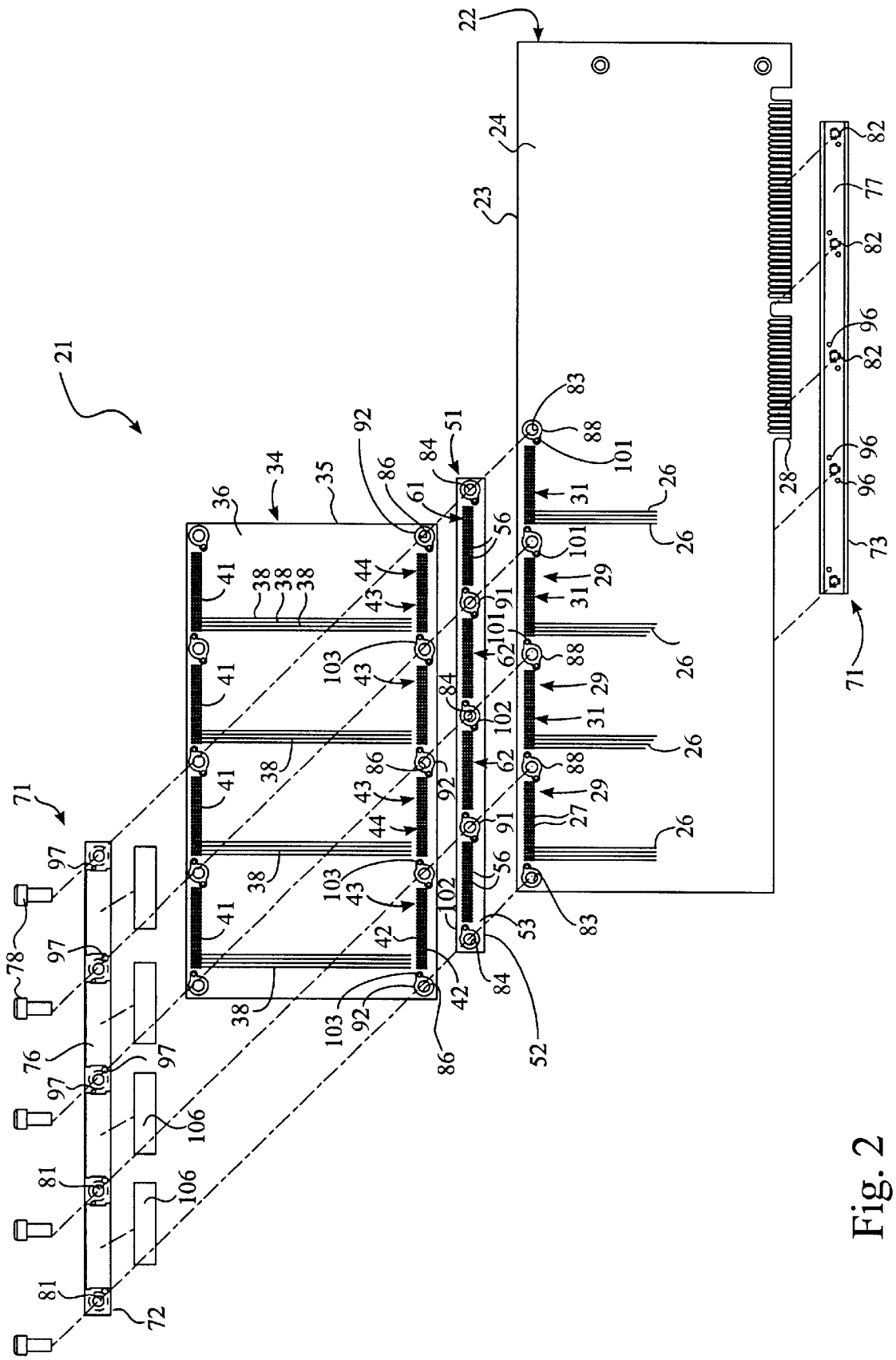
FIG. 2 is an exploded view of the high density electrical connector assembly of FIG. 1.

More in particular, the high density electrical connector assembly 21 of the present invention includes a first printed circuit board in the form of rigid printed circuit board 22 having a sheet-like body or substrate in the form of planar body 23 (see FIGS. 1–3). The planar body 23 is made from any suitable insulating material such as fiberglass or other rigid printed circuit boards material commonly known to the industry and has a first or top surface 24 and a parallel second or bottom surface 25. The thickness between surfaces 24 and 25 ranges from approximately 0.015 to 0.125 inch. A plurality of electrical traces 26 extend along planar body 23 to a plurality of first interconnect pads 27. The electrical traces 26 can be formed on either or both of surfaces 24 and 25 or, alternatively, can be formed on an internal surface of planar body 23 so as to be partially or totally inside printed circuit board 22. Each of the electrical traces 26 terminates at one of its ends at one of the first interconnect pads 27 disposed on one of surfaces 24 or 25. In the illustrated embodiment of connector assembly 21, first interconnect pads 27 are disposed on top surface 24 adjacent one of the edges of the printed circuit board 22. For simplicity, the electrical traces 26 are shown only in FIG. 2 where only several of such traces are shown on top surface 24. A conventional edge connector 28 is further provided on board 22.

Four groups 29 of interconnect pads 27 are provided on top surface 24, as shown most clearly in FIG. 2. First interconnect pads 27 are shown in FIG. 2 as being of equal diameter and shape, however interconnect pads 27 of varying sizes and shapes can be provided. Each of first interconnect pads 27 is disk-like in shape and made from any suitable conductive material such as copper. Pads 27 have a suitable diameter, such as approximately 0.025 inch. First interconnect pads 27 of each group 29 are disposed in any suitable pattern 31. In one preferred embodiment of connector assembly 21, each pattern 31 consists of a grid of interconnect pads 27 arranged in four rows and twenty-five columns.

The separation pitch between each row and each column in pattern 31 is approximately 0.050 inch or less, although smaller pitches as low as 0.003 inch or less with vapor deposition printed circuit board techniques or 0.016 inch with standard printed circuit board electroplating, masking and etching techniques can be provided. The preferred pitch will vary in these ranges as a function of the specific application. Connector assembly 21 can have greater than or less than the four groups 29 and the groups 29 can have other patterns 31 and any number of first interconnect pads 27.

Connector assembly 21 further includes a second printed circuit board in the form of flexible printed circuit cable 34 having a first sheet-like body or substrate in the form of flexible sheet 35 (see FIGS. 1–3). The flexible sheet 35 is made from any suitable insulating material such as a polyimide film such as Kapton manufactured by E.I. duPont de Nemours and Company of DuPont Road, Circleville, Ohio 43113. Sheet 35 is formed with a first or top surface 36 and an opposite second or bottom surface 37 and has a thickness between surfaces 36 and 37 of approximately 0.002 inch. A plurality of second electrical traces 38 are formed on one or both of surfaces 36 and 37 by any suitable means such as any conventional printed circuit board manufacturing process including electroplating, masking, etching and vapor deposition. In the illustrated embodiment, second electrical traces 38 are formed on both surfaces 36 and 37 although, for simplicity, only several of second electrical traces 38 are shown on top surface 36 in FIGS. 1 and 2. Each of the second electrical traces 38 extends from a first interconnect pad 41 provided at one end of flex cable 34 to a second interconnect pad 42 provided at the other end of the flexible cable. Second interconnect pads 38 on flexible cable 34 are formed on bottom surface 37 and are shown in phantom in FIG. 2. The second interconnect pads 42 are similar in composition and construction to first interconnect pads 27 and preferably each of the second interconnect pads 42 has a size and shape in plan which is substantially identical to the size and shape of the respective first interconnect pad 27 on rigid printed circuit board 22.

Second interconnect pads 42 are arranged on flexible cable 34 in at least one group and as shown are arranged in a plurality of four groups 43. Each group of second interconnect pads 42 is arranged in a pattern 44 that is a mirror image of the pattern 31 of the respective group 29 on rigid printed circuit board 22. In the illustrated embodiment of connector assembly 21, pattern 44 is substantially identical to pattern 31 and consists of a grid formed with four rows and twenty-five columns. The separation pitch between each row and column in pattern 44 is the same as the corresponding separation pitch in pattern 31.

A connector or cable interposer 51, shown in plan in FIG. 4, is included within connector assembly 21 and is formed from a flexible sheet 52 made from any suitable insulating and compliant material such as plastic. A preferred material for flexible sheet 52 is a polyimide film such as the polyimide film sold under the trademark KAPTON Flexible sheet 52 is formed with a first or top planar surface 53 and an opposite second or bottom planar surface 54 and has a thickness between surfaces 53 and 54 ranging from 0.001 to 0.002 inch. A plurality of first planar connector pads 56 are formed on top surface 53 and a plurality of second planar connector pads 57 are formed on bottom surface 54. Connector pads 56 and 57 are each formed by any suitable means, such as any conventional printed circuit board manufacturing process including electroplating, masking, etching and vapor deposition, and are each made from any suitable conductive material such as a layer of 0.5 ounce copper having a thickness of approximately 0.0075 inch. Connector pads 56 and 57 further include a layer of gold plate that has a thickness of approximately 0.000020 inch and is deposited on top of the copper layer. An optional layer of particle interconnect material 58 of the type described in any of U.S. Pat. Nos. 4,804,132, 5,083,697, 5,334,809, 5,430,614, 5,471,151, 5,506,514, 5,565,280, 5,634,265, 5,642,055 and 5,670,251, the entire contents of which are incorporated herein by this reference, is disposed atop the gold plate layer.

First connector pads 56 are adapted for engagement with first interconnect pads 41. In this regard, the plurality of first connector pads 56 on top surface 53 are arranged in a plurality of groups 61 corresponding in number and configuration to groups 29 of first interconnect pads 27. More specifically, the first connector pads 56 in each group 61 are arranged in a pattern 62 that is a mirror image of pattern 31 of first interconnect pads 27. First connector pads 56 in each pattern 62 preferably have a size and shape corresponding to the size and shape of the respective first interconnect pads 27 of pattern 31. The horizontal and vertical separation pitch of first connector pads 56 thus corresponds to the horizontal and vertical separation pitch of first interconnect pads 27 discussed above. Second connector pads 57 are similarly arranged on bottom surface 54 in a plurality of groups corresponding in number to groups 43 of second interconnect pads 42. Each of second connector pads 57 is aligned, as shown in FIG. 5, with the respective first connector pad 56 on top surface 53. As such, the second connector pads 57 in each group are arranged in a pattern that is a mirror image of pattern 62 of first connector pads 56.

Means is included within high density cable interposer 51 for electrically connecting respective first and second connector pads 56 and 57. In one preferred embodiment of interposer 51, said electrical connection means includes a via 66 which extends through flexible sheet 52 and is connected at one end to the first connector pad 56 and at the other end to the second connector pad 57 (see FIGS. 5 and 6).

Connector assembly 21 has clamping means 71 carried by at least one of rigid printed circuit board 22 and flexible cable 34 for securing together printed circuit board 22, cable interposer 51 and flexible cable 34. Clamping means 71 includes a first elongate clamp 72 mountable to rigid printed circuit board 22 and a second elongate clamp 73 mountable to flexible printed circuit cable 34. First and second clamps 72 and 73 are similar in size, shape and construction and, in this regard, are each made from any suitable material such as aluminum. First clamp 72 is formed with a planar surface 76 having a size and shape preferably at least as large as the profile in plan of the plurality of first interconnect pads 27 on rigid printed circuit board 22. Second clamp 73 has a similar planar surface 77 which has a size and shape at least as large as the profile in plan of the second interconnect pads 42 of flexible printed circuit cable 34.

A plurality of fasteners in the form of bolts 78 are included in clamping means 71 for securing together the first and second clamps 72 and 73. First clamp 72, rotated 180° about its longitudinal axis in FIG. 2 so as to show planar surface 76 thereof, is provided with a plurality of bores 81 for receiving bolts 78. Second clamp 73 has an equal plurality of bores 82 for threadably receiving the threaded ends of bolts 78. A plurality of bores 83, 84 and 86 are respectively provided in planar body 23, flexible sheet 52 and flexible sheet 35 for permitting the passage of bolts 78 through rigid printed circuit board 22, cable interposer 51 and flexible cable 34. First and second reinforcing rings 88 are attached to respective top and bottom surfaces 24 and 25 of planar body 23 for each of bores 83 to reinforce the planar body 23 about the bore 83. Each of the reinforcing rings 88 extends around the opening of the respective bore 83 and is formed on surface 24 by any suitable means such as any conventional printed circuit board manufacturing process including electroplating, masking, etching and vapor deposition. Similar reinforcing rings 91 are provided on top and bottom surfaces 53 and 54 of flexible sheet 82 for each of bores 84 and similar reinforcing rings 92 are formed on the top and bottom surfaces 36 and 37 of flexible sheet 35 for each of bores 86.

Clamping means 71 includes means for registering rigid printed circuit board 22 relative to cable interposer 51 so as to cause first interconnect pads 27 to register with respective first connector pads 56 and means for registering flexible printed circuit cable 34 relative to the cable interposer 51 so as to cause second interconnect pads 42 to register with second connector pads 57. Such registration means includes bolts 78 and bores 83, 84 and 86 and further includes a plurality of rigid pins 96 preferably formed from the material of second clamp 73 and extending perpendicularly of planar surface 77 adjacent bores 82. First clamp 72 is provided with an equal plurality of holes 97 extending through planar surface 76 for receiving the ends of registration pins 96. A plurality of holes 101–103 are respectively provided in planar body 23, flexible sheet 52 and flexible sheet 35 for receiving registration pins 96 when the rigid printed circuit board 22, the cable interposer 51 and the flexible printed circuit cable 34 are properly aligned relative to each other.

A layer of an elastomeric material is optionally disposed between first clamping surface 76 and 30 cable interposer 51 for facilitating electrical connections between first interconnect pads 27 and first connector pads 56 and between second interconnect pads 42 and second connector pads 57. In the illustrated embodiment of connector assembly 21, such layer is in the form a plurality of pads 106 made from any suitable material such as silicone rubber or Sarcon from Fujipoly America Corp., 365 Carnegie Avenue, Kenilworth, New Jersey 07033. Pads 106 are secured to planar surface 76 of the first clamp 72 between bores 81 by any suitable means such as an adhesive. Each of the pads 106 engages top surface 36 of flexible sheet 35 behind a group 43 of second interconnect pads 42. As such, each of pads 106 has a size and shape at least as large as pattern 44 of the second interconnect pads 42. Pads 106 can have a thickness ranging from 0:020 to 0.100 inch and preferably approximately 0.020 inch.

In operation and use, connector assembly 21 is assembled by positioning cable interposer 51 between rigid printed circuit board 22 and flexible printed circuit cable 34 so that first interconnect pads 27 register with and engage first connector pads 56 and second interconnect pads 42 register with and engage second connector pads 57. More specifically, assembly 21 can be sequentially pieced together on second clamp 73 by aligning holes 101 in planar body 23 with registration pins 96 so as to mount rigid printed circuit board 22 to second clamp 73, next aligning holes 52 in flexible sheet 52 with the registration pins 96 so as to mount cable interposer 51 to the second clamp and lastly aligning holes 103 in flexible sheet 35 with the registration pins so as to mount flexible printed circuit cable 34 to the second clamp. First clamp 72 is pressed against top surface 23 of flexible sheet 25 and aligned so that holes 97 in the first clamp register with pins 96 in the second clamp. Bolts 78 are subsequently introduced through bores 81 in first clamp 72 and threadably secured within bores 82 of second clamp 73. When so assembled, first and second clamps 72 and 73 serve to urge rigid printed circuit board 22 and flexible printed circuit cable 34 together. Top surface 24 of rigid printed circuit board 22 faces bottom surface 37 of flexible printed circuit cable 34 so that first interconnect pads 27 face second interconnect pads 42, separated by first and second connector pads 56 and 57 of cable interposer 51.

The compliant material of flexible sheet 52 disposed between the plurality of first and second interconnect pads 27 and 42, facilitates an electrical connection between interconnect pads 27 and 42 and the respective plurality of connector pads 56 and 57. Specifically, flexible sheet 52 can bend where necessary to accommodate any irregularities in the thicknesses of planar body 23 of rigid printed circuit board 22 and flexible sheet 35 of flexible printed. circuit cable 34 and similarly any irregularities in the thicknesses of first and second interconnect pads 27 and 42. The layer of particle interconnect material 58 provided on each of first and second connector pads 56 and 57 further facilitates the electrical connections between the connector pads 56 and 57 and the respective interconnect pads 27 and 42.

The electrical connections resulting from high density electrical connector assembly 21 occupy a relatively small footprint. Cable interposer 51 is relatively simple in construction and can be easily manufactured by any conventional printed circuit board manufacturing process including electroplating, masking, etching and vapor deposition. As discussed above, the configuration of electrical connections and the size and shape of respective interconnect and connector pads can be easily varied as desired. Connector assembly 21 can be disassembled and reassembled as needed with confidence that repeatable electrical connections between first and second interconnect pads 27 and 42 are being made. In addition, cable interposer 51 is reusable.

Although connector assembly 21 has been shown and described as having only first and second flexible or rigid printed circuit boards, it should be appreciated that more than two such boards can be included in a connector assembly of the present invention. For example, an additional plurality of interconnect pads can be provided on bottom surface 25 of rigid printed circuit board 22 opposite first interconnect pads 27 and electrically coupled to a second flexible printed circuit cable similar to cable 34 by means of an additional cable interposer similar to cable interposer 51. A single stack consisting of a circuit board, an interposer, a second circuit board, a second interposer and a third circuit board sandwiched between first and second clamps 72 and 73 can be provided in such an assembly. Alternatively, an additional set of interconnect pads can be provided on rigid printed circuit board 22 and offset from groups 29 of first interconnect pads 27 and an additional set of clamps 72 and 73 utilized for forming a second connector assembly. It should be further appreciated that cable interposer 51 can be used with any combination of rigid or flexible printed circuit boards.

Figure 7:
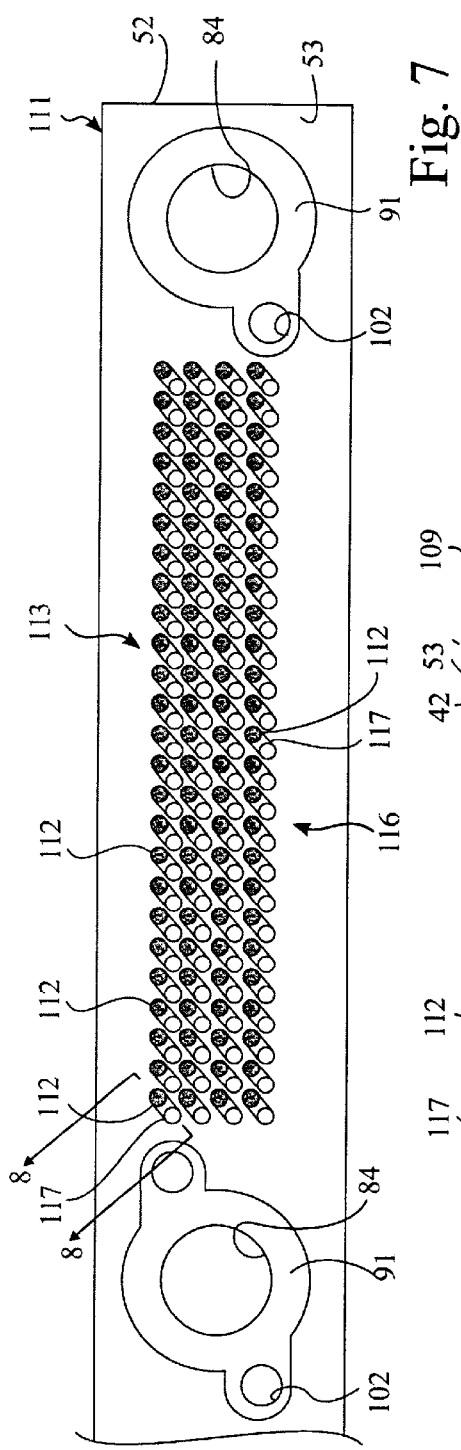
FIG. 7 is a plan view of a portion of another embodiment of a connector for use in a high density electrical connector assembly of the present invention.
Figure 8:
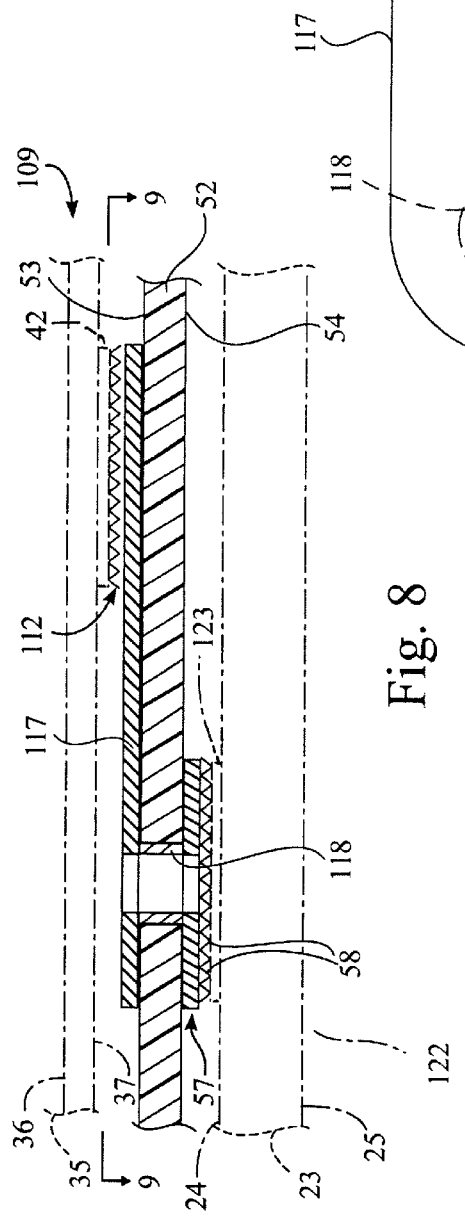
FIG. 8 is a cross-sectional view of a portion of the connector of FIG. 7 taken along the line 8—8 of FIG. 7.
Figure 9:
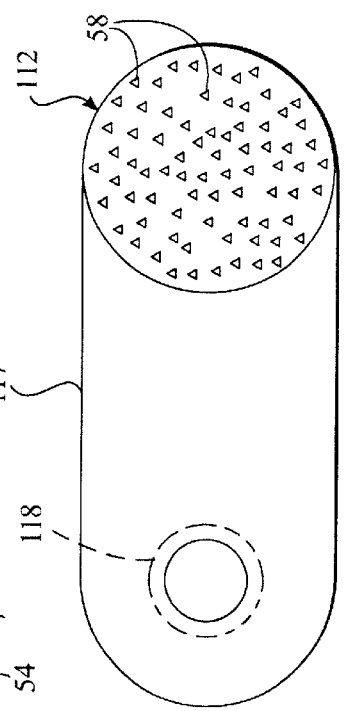
FIG. 9 is a top plan view of the connector of FIG. 7 taken along the line 9—9 of FIG. 8.

The high density electrical connector of the present invention can have other embodiments for enhancing electrical connections between interconnect pads of first and second flexible or rigid printed circuit boards. For example, a portion of a high density electrical connector assembly 109 is shown in FIG. 8 and includes a high density electrical connector or cable interposer 111, a portion of which is shown in FIG. 7, that has similarities to cable interposer 51. Like reference numerals have been used to describe like components of cable interposers 51 and 111. Flexible sheet 52 of cable interposer 111 has a plurality of first connector pads 112 that are substantially similar to first connector pads 56 and are disposed on top surface 53 of the flexible sheet. In the illustrated embodiment of connector assembly 109, the plurality of first connector pads 112 are arranged in four groups 113 with the connectors pads 112 in each group 113 being arranged in a pattern 116 which is substantially identical to pattern 62. Each of first connector pads 112 is offset with respect to the respective second connector pad 57 and, as such, the pattern of first connector pads 112 is offset with respect to the pattern of second connector pads 57. More specifically, each of the fist connector pads 112 is offset with respect to the respective second connector pad 57 by an amount at least equal to the diameter of such second connector pad 57. An electrical trace 117 preferably made from the same copper material utilized in first connector pads 112 extends from the first connector pad 112 to a position overlying the respective second connector pad 57. A via 118 substantially similar to via 66 is included within the means of cable interposer 111 for connecting each second connector pad 57 to the electrical trace 117 of the respective first connector pad 112.

Connector assembly 109 has a rigid printed circuit board 122 which is substantially identical to rigid printed circuit board 22 except that first interconnect pads 123 of the rigid printed circuit board 122 are offset relative to first interconnect pads 27 of rigid printed circuit board 22 by an amount equal to the offset of first connector pads 112 relative to second connector pads 57. As such, first interconnect pads 123 ofthe rigid printed circuit board 22 are offset with respect to second interconnect pads 42 of flexible printed circuit cable 34. It should be appreciated that cable interposer 111 can be utilized with any combination of flexible and/or rigid printed circuit board so long as a first and second interconnect pads of such boards are offset in the manner that first connector pads 112 of the cable interposer are offset with respect to second connector pads 57.

In operation and use, connector assembly 109 is assembled in the same manner as discussed above with respect to connector assembly 21. The first connector pads 112 are pivotable by means of flexible sheet 52 of cable interposer 111 with respect to second connector pads 57 for enhancing electrical connections between first interconnect pads 123 and second interconnect pads 42. In this manner, cable interposer 111 can further accommodate irregularities in the thicknesses of either rigid printed circuit board 122 or flexible printed circuit cable 34 or discrepancies in the thicknesses of first interconnect pads 123 or in the thicknesses of second interconnect pads 42.

From the foregoing, it can be seen that a high density electrical connector assembly having a small footprint has been provided. The connector assembly does not utilize soldered connections and can be easily disassembled and reassembled. The connector assembly preferably has a plurality of interconnect and connector pads which can be of any suitable size and shape and arranged in any suitable pattern. A reusable and compliant interposer for disposition between first and second printed circuit boards is included in the connector assembly.

What is claimed is:

1. A high density electrical connector assembly comprising a first sheet-like body of an insulating material having a surface and a plurality of electrical traces extending to a plurality of first interconnect pads disposed on the surface in a first pattern, a second sheet-like body of an insulating material having a surface and a plurality of second electrical traces extending to a plurality of second interconnect pads disposed on the surface of the second sheet-like body in a second pattern, the second pattern being substantially a mirror image of the first pattern, the surface of the first sheet-like body facing the surface of the second sheet-like body so that the first interconnect pads face the second interconnect pads, a flexible sheet of an insulating and compliant material disposed between the first and second interconnect pads and having first and second opposite planar surfaces, a plurality of first connector pads disposed on the first planar surface in the first pattern and a plurality of second connector pads disposed on the second planar surface in the second pattern and electrically connected through the flexible sheet to the first connector pads and clamping means mountable to the first and second sheet-like bodies for urging the first and second sheet-like bodies and the flexible sheet together so that the first interconnect pads register with and engage the first connector pads and the second interconnect pads register with and engage the second connector pads whereby the compliant material of the flexible sheet facilitates electrical connections between the first interconnect pads and the first connector pads and between the second interconnect pads and the second connector pads for making electrical connections between the first and second interconnect pads.

2. A connector assembly as in claim 1 wherein the flexible sheet has a plurality of first connector pads arranged in rows and columns and having a separation pitch of approximately 0.050 inch or less.

3. A connector assembly as in claim 2 wherein the plurality of first connector pads have a separation pitch of approximately 0.016 inch or less.

4. A connector assembly as in claim 2 wherein the plurality of first connector pads have a separation pitch of approximately 0.003 inch or less.

5. A connector assembly as in claim 1 wherein the flexible sheet is a layer of plastic having a constant thickness ranging from 0.001 to 0.002 inch.

6. A connector assembly as in claim 5 wherein the flexible sheet is made from a polyimide film.

7. A connector assembly as in claim 1 wherein the first connector pads on the first planar surface of the flexible sheet are aligned with respective second connector pads on the second planar surface of the flexible sheet.

8. A connector assembly as in claim 1 wherein the first pattern of the first interconnect pads is offset with respect to the second pattern of the second interconnect pads and wherein the first connector pads on the first planar surface of the flexible sheet are offset with respect to respective second connector pads on the second planar surface of the flexible sheet, the flexible sheet being cantilevered between respective first and second interconnect pads for further facilitating electrical connections between the first and second interconnect pads.

9. A connector assembly as in claim 8 wherein the second connector pads have respective diameters and wherein the first connector pads are offset with respect to respective second connector pads by an amount at least equal to the respective diameters so that the first connector pads are pivotable by the flexible sheet relative to respective second connector pads for enhancing electrical connections between respective first and second interconnect pads.

10. A connector assembly as in claim 1 wherein the first sheet-like body is a rigid printed circuit board and the second sheet-like body is a flexible printed circuit board.

11. A connector assembly as in claim 1 wherein the first and second sheet-like bodies are each flexible printed circuit boards.

12. A connector assembly as in claim 1 wherein the second sheet-like body is a flexible printed circuit board and wherein the clamping means includes a first clamp having a first planar clamping surface at least as large as the first pattern and a layer of an elastomeric material disposed between the first clamping surface and the second sheet-like body for facilitating electrical connections between the first and second interconnect pads and the first and second connector pads.

13. A high density electrical connector for use with a first sheet-like body of an insulating material having a surface and a plurality of first interconnect pads disposed on the surface in a first pattern and a second sheet-like body of an insulating material having a surface and a plurality of second interconnect pads disposed on the surface of the second sheet-like body in a second pattern that is substantially a mirror image of the first pattern comprising a flexible sheet of an insulating and compliant material having first and second opposite surfaces, a plurality of first planar connector pads disposed on the first surface in the first pattern and a plurality of second planar connector pads disposed on the second surface in the second pattern, the first and second planar connector pads being electrically connected through the flexible sheet and the first pattern of the first connector pads being offset relative to the second pattern of the second connector pads, whereby the flexible sheet is adapted for disposition between the first and second sheet-like bodies so that the first interconnect pads register with and engage the first planar connector pads and the second interconnect pads register with and engage the second planar connector pads, the flexible sheet being cantilevered between respective first and second connector pads for facilitating electrical connections between the first and second interconnect pads.

14. A connector as in claim 13 wherein the flexible sheet has a plurality of first planar connector pads arranged in rows and columns and having a separation pitch of approximately 0.050 inch or less and a plurality of second planar connector pads arranged in rows and columns and having a separation pitch of approximately 0.050 inch or less.

15. A connector as in claim 13 wherein each of the first planar connector pads has a diameter of approximately 0.025 inch or less.

16. A connector as in claim 15 wherein each of the first planar connector pads includes a layer of a conductive material and a layer of particle interconnect material disposed on the layer of the conductive material.

* * * * *